United States Patent
Dabusc

(10) Patent No.: US 9,814,164 B2
(45) Date of Patent: Nov. 7, 2017

(54) SEALING ASSEMBLY SYSTEM AND METHOD

(71) Applicant: ISRAEL AEROSPACE INDUSTRIES LTD., Lod (IL)

(72) Inventor: Efraim Dabusc, Holon (IL)

(73) Assignee: ISRAEL AEROSPACE INDUSTRIES LTD., Lod (IL)

(*) Notice: Subject to any disclaimer, the term of this patent is extended or adjusted under 35 U.S.C. 154(b) by 0 days.

(21) Appl. No.: 14/397,625

(22) PCT Filed: Apr. 23, 2013

(86) PCT No.: PCT/IL2013/050347
§ 371 (c)(1),
(2) Date: Oct. 28, 2014

(87) PCT Pub. No.: WO2013/164818
PCT Pub. Date: Nov. 7, 2013

(65) Prior Publication Data
US 2015/0101859 A1     Apr. 16, 2015

(30) Foreign Application Priority Data
Apr. 30, 2012 (IL) .......................................... 219476

(51) Int. Cl.
*H05K 9/00* (2006.01)
*F16J 15/06* (2006.01)
(Continued)

(52) U.S. Cl.
CPC .......... *H05K 9/0015* (2013.01); *F16J 15/022* (2013.01); *F16J 15/061* (2013.01);
(Continued)

(58) Field of Classification Search
CPC ................................................. H05K 9/0015
(Continued)

(56) References Cited

U.S. PATENT DOCUMENTS 5,898,127 A * 4/1999 Schuhmacher .......... H05K 5/06
174/367
6,037,846 A * 3/2000 Oberhammer ..... H01R 13/7195
174/367

(Continued)

FOREIGN PATENT DOCUMENTS

EP        2312186         4/2011
WO    WO 2009/126684    10/2009

OTHER PUBLICATIONS

International Search Report and Written Opinion from International Application No. PCT/IL2013/050347 dated Sep. 17, 2013.

*Primary Examiner* — Hung V Ngo
(74) *Attorney, Agent, or Firm* — Dorsey & Whitney LLP

(57) ABSTRACT

An assembly (500) is provided including: a first component (10) having a first outer surface (15) defining an opening therein; a second component (30) having second surface (60); and a sealing system (100). The sealing system includes a sealing member (200) and a support member (300). The sealing member is configured for providing sealing between the first component and the second component with respect to the opening and along a generally non-planar sealing perimeters. The support member is configured for supporting the sealing member in a generally non-planar configuration corresponding to the generally non-planar sealing perimeter. At least one of the second component and the support member is configured for enabling the sealing system to be mounted to the second component in a sealing position wherein to align the sealing member with the second component along the sealing perimeter. The support member is configured for being sealingly affixed to the first component subsequent to the system being mounted to the second component in the sealing position.

21 Claims, 5 Drawing Sheets

(51) Int. Cl.
*F16J 15/12* (2006.01)
*F16J 15/02* (2006.01)

(52) U.S. Cl.
CPC ........... *F16J 15/062* (2013.01); *F16J 15/123* (2013.01); *H05K 9/0081* (2013.01)

(58) Field of Classification Search
USPC ........................................................ 174/367
See application file for complete search history.

(56) References Cited

U.S. PATENT DOCUMENTS

| | | | |
|---|---|---|---|
| 6,499,797 B1 | | 12/2002 | Bohm et al. |
| 7,878,814 B2 | * | 2/2011 | Chin ...................... F16J 15/064 |
| | | | 174/367 |
| 2005/0003158 A1 | | 1/2005 | Yamasa et al. |
| 2008/0197581 A1 | | 8/2008 | Galpin |
| 2010/0128456 A1 | * | 5/2010 | Hughes ................ H05K 9/0045 |
| | | | 361/818 |
| 2010/0212230 A1 | | 8/2010 | Ogilvie |
| 2010/0308626 A1 | | 12/2010 | Grummett et al. |

* cited by examiner

SEALING ASSEMBLY SYSTEM AND METHOD

FIELD

The presently disclosed subject matter relates to sealing devices, sealing systems and sealing methods, and to associated assemblies.

BACKGROUND

Sealing devices and systems for sealing between two components are well known, and include, for example, many varieties of O-rings. However, O-rings are considered in the art to be limited in application, conventionally providing a sealing perimeter that is generally planar.

GENERAL DESCRIPTION

According to at least one aspect of the presently disclosed subject matter, there is provided an assembly comprising:
(i) a first component having a first outer surface defining an opening therein;
(ii) a second component having a second surface;
(iii) a sealing system comprising:
a) a sealing member configured for providing sealing between said first component and said second component with respect to said opening and along a generally non-planar sealing perimeter; and
b) a support member configured for supporting said sealing member in a generally non-planar configuration corresponding to said generally non-planar sealing perimeter;
wherein at least one of the second component and the support member is configured for enabling the sealing system to be mounted to the second component in a sealing position wherein to align said sealing member with said second component along said sealing perimeter, and
wherein said support member is configured for being sealingly affixed to said first component subsequent to said system being mounted to said second component in said sealing position.

For example, the second surface can be a non-planar surface.

For example, said support member is different from and/or independent from said first component For example, said second component comprises a component perimeter in registry with said opening, the system defining a gap between said opening and said component perimeter, and wherein said sealing member provides said sealing between said first component and said second component along said gap.

In at least one example, said second surface is generally conformal with respect to said first surface.

For example, said sealing perimeter is of a general skew polygonal shape.

For example, the assembly is optionally further configured to provide electromagnetic interference (EMI) shielding between said first component and said second component. For example, said sealing member is electrically conducting.

In at least one example, said first component and said second component are made from materials having significantly different thermal expansion characteristics one from the other. For example, said first component and said second component are made from materials having significantly different coefficients of thermal expansion one from the other. For example, a ratio between the respective coefficients of thermal expansion of said first component and said second component are in the range from about 2 to about 10, or in the range from about 3 to 9, or in the range from about 4 to 8, or in the range from about 5 to 7, or in the range from about 5 to about 6. Additionally or alternatively, said sealing member is configured to provide said sealing therebetween within a temperature range for example between about −10° C. and about 500° C., or between about −50° C. to about 700° C. For example, said support member is made from a material having thermal expansion characteristics similar to the thermal expansion characteristics of one of said first component.

For example, the assembly optionally further comprises an electromagnetic interference (EMI) shielding member, different from said sealing member. For example, said EMI shielding member comprises a plurality of electrically conductive fingers, each finger being configured for being affixed to the support member and in electrical communication therewith, and for establishing further electrical contact by physically contacting one of the two components when the sealing system is mounted thereto.

Additionally or alternatively, the sealing member can comprise one or more features similar to those of the sealing member according to other aspects of the presently disclosed subject matter, for example as disclosed below, mutatis mutandis.

Additionally or alternatively, the sealing system and/or the support member can comprise one or more features similar to those of the sealing system and/or the support member according to other aspects of the presently disclosed subject matter, for example as disclosed below, mutatis mutandis.

According to at least one aspect of the presently disclosed subject matter, there is provided a sealing member configured for providing sealing between two components along a generally non-planar sealing perimeter.

For example, said sealing member can be in the form of a generally non-planar gasket, at least when in use in a sealing position between the two components. In the sealing portion is such as to enable said sealing member to be aligned with said second component along said sealing perimeter Additionally or alternatively, the sealing member according is configured for assuming a generally non-planar configuration corresponding to said generally non-planar sealing perimeter.

Additionally or alternatively, said generally non-planar sealing perimeter is non-axisymmetric. Additionally or alternatively said sealing perimeter is of a general skew polygonal shape.

For example, the sealing member comprises an elongate body looped to form a closed general skew polygonal shape.

For example, said sealing member is configured for assuming said generally non-planar configuration in the absence of external forces acting thereon. Optionally, said sealing member comprises an outer sealing portion concentrically enclosing an inner core that is configured to internally support the sealing member in a non-planar form. For example, inner core is configured to internally support the sealing member in a general skew polygonal shape. For example, said outer sealing portion is made from a resilient material, and/or, said inner core is made from a memory shape alloy.

The sealing member can be resilient, and optionally can be made wholly from a resilient material, for example rubber or silicone.

In at least one example, the two components being sealed by said sealing member are made from materials having significantly different coefficients of thermal expansion one from the other. For example, a ratio between the respective coefficients of thermal expansion of the two components can be in the range from about 2 to about 10, or in the range from about 3 to 9, or in the range from about 4 to 8, or in the range from about 5 to 7, or in the range from about 5 to about 6. Additionally or alternatively, said sealing member is configured to provide said sealing therebetween within a temperature range for example between about −10° C. and about 500° C., or between about −50° C. to about 700° C.

Optionally, the sealing member is further configured to provide electromagnetic interference (EMI) shielding between the two components. For example, the sealing member is further configured to provide said EMI shielding between the two components concurrently with providing said sealing between the two components. For example, the sealing member is electrically conducting. For example, said sealing member is made from EMI shielding materials that also provide a mechanical seal. For example, said sealing member is made from EMI shielding materials having silicone rubber capabilities. For example, said sealing member is made from electrically conductive silicone rubber compounds. For example, said sealing member is made from silicone rubber or fluorosilicone rubber, the silicone rubber or fluorosilicone rubber having embedded silver plated aluminum particles, silver plated glass beads, silver plated copper particles, nickel-graphite particles or conductive carbon. For example, said sealing member comprises an oriented electrically conductive mesh impregnated with silicone. For example, said sealing member is configured for providing EMI shielding by absorbing electromagnetic (EM) energy and for converting the absorbed EM energy into heat that is then dissipated, and optionally said sealing member is made from a flexible EMI absorbing material.

According to at least one aspect of the presently disclosed subject matter, there is provided a sealing system comprising a sealing member as defined above, and a support member configured for supporting said sealing member in a generally non-planar configuration wherein to provide said non-planar sealing perimeter.

For example, said support member is made from a material having thermal expansion properties similar to the thermal expansion properties of one of the two components.

Additionally or alternatively, said support member is configured for supporting the sealing member in a non-planar configuration wherein to provide said non-planar sealing perimeter.

Additionally or alternatively, said support member is configured for supporting said sealing member in a general skew polygonal shape.

Additionally or alternatively, said support member is configured for enabling the sealing member to assume a desired relative position with respect to a first one of the two components by mounting the support member to the first component at a fixed spatial disposition with respect thereto.

Additionally or alternatively, said support member is configured for being affixed to a second one of the two components.

For example, in use said support member is affixed to one of the two components after the support member is mounted in a sealing relationship to the other one of the two components.

Additionally or alternatively, said support member is generally non-planar. Additionally or alternatively, said support member has a shape that varies along three orthogonal axes. Additionally or alternatively, said support member has a general skew polygonal shape. Additionally or alternatively, said support member has a general skew polygonal shape corresponding to a general skew polygonal shape of the sealing perimeter.

For example, said support member is in the form of a generally non-planar rigid or semi rigid frame. For example, said support member comprises a sealing member seat and a flange portion, and optionally said sealing member seat and said flange portion are integral with one another. For example, said sealing member seat is in the form of a peripheral recess along an upper part of an internal periphery of the frame, the recess having a cross-sectional shape complementary to part of the transverse cross-sectional shape of the sealing member. Additionally or alternatively, said sealing member seat has a three-dimensional form similar to the form of the sealing perimeter.

Additionally or alternatively, said sealing member is affixed to said support member to provide an assembled configuration.

Additionally or alternatively, said sealing member is affixed to said support member to provide said non-planar sealing perimeter.

In at least some examples, the sealing system is configured for providing electromagnetic interference (EMI) shielding between the two components independently of said sealing member. For example, the sealing system further comprises an electromagnetic interference (EMI) shielding member. For example, said EMI shielding member comprises a plurality of electrically conductive fingers, each finger being configured for being affixed to the support member and in electrical communication therewith, and for establishing further electrical contact by physically contacting one of the two components when the sealing system is mounted thereto.

According to at least one aspect of the presently disclosed subject matter, there is provided a sealing method, comprising providing sealing between two components along a generally non-planar sealing perimeter.

In at least one example, the sealing system as defined above is used to seal between the two components.

For example, the sealing method comprises: providing a sealing system comprising a sealing member mounted onto a support member, wherein said support member is configured for compelling said sealing member to assume a configuration capable of sealing along said generally non-planar sealing perimeter, and using said sealing system to seal between the two components about said sealing perimeter. The sealing method can optionally further comprise mounting the sealing system onto one of the components to seal with respect thereto about said sealing perimeter, and subsequently affixing the support member to the other one of said components. The sealing method can additionally or alternatively optionally further comprise providing electromagnetic interference shielding between the two components concurrently with sealing between the two components.

Features of at least one example of the presently disclosed subject matter can include one or more of the following:
  relatively low-cost system and method for concurrently providing environmental seal and EMI shielding, between two components, for example for use in missiles.
  reversible sealing, particularly where the sealing perimeter is non-planar and defines a complex 3D form.

provides a seal that can operate with respect to a relatively large range of tolerances between the dimensions of the two components at the sealing perimeter.

provides a sealing perimeter can move with respect to at least one of these components to compensate for the range of tolerances.

provides a seal in applications where there can be a relatively large range in the thermal expansion characteristics between the two components and/or in the temperature actually felt by the components.

provides a seal in applications having a wide range of different 3D shapes for the sealing perimeter.

the seal can provide vibration damping between the 2 components.

The support structure can provide mechanical strengthening and/or stiffening around the opening of one of the components that is being sealed.

BRIEF DESCRIPTION OF THE DRAWINGS

In order to understand the presently disclosed subject matter and to see how it can be carried out in practice, examples will now be described, by way of non-limiting example only, with reference to the accompanying drawings, in which.

DETAILED DESCRIPTION

Figure 1:
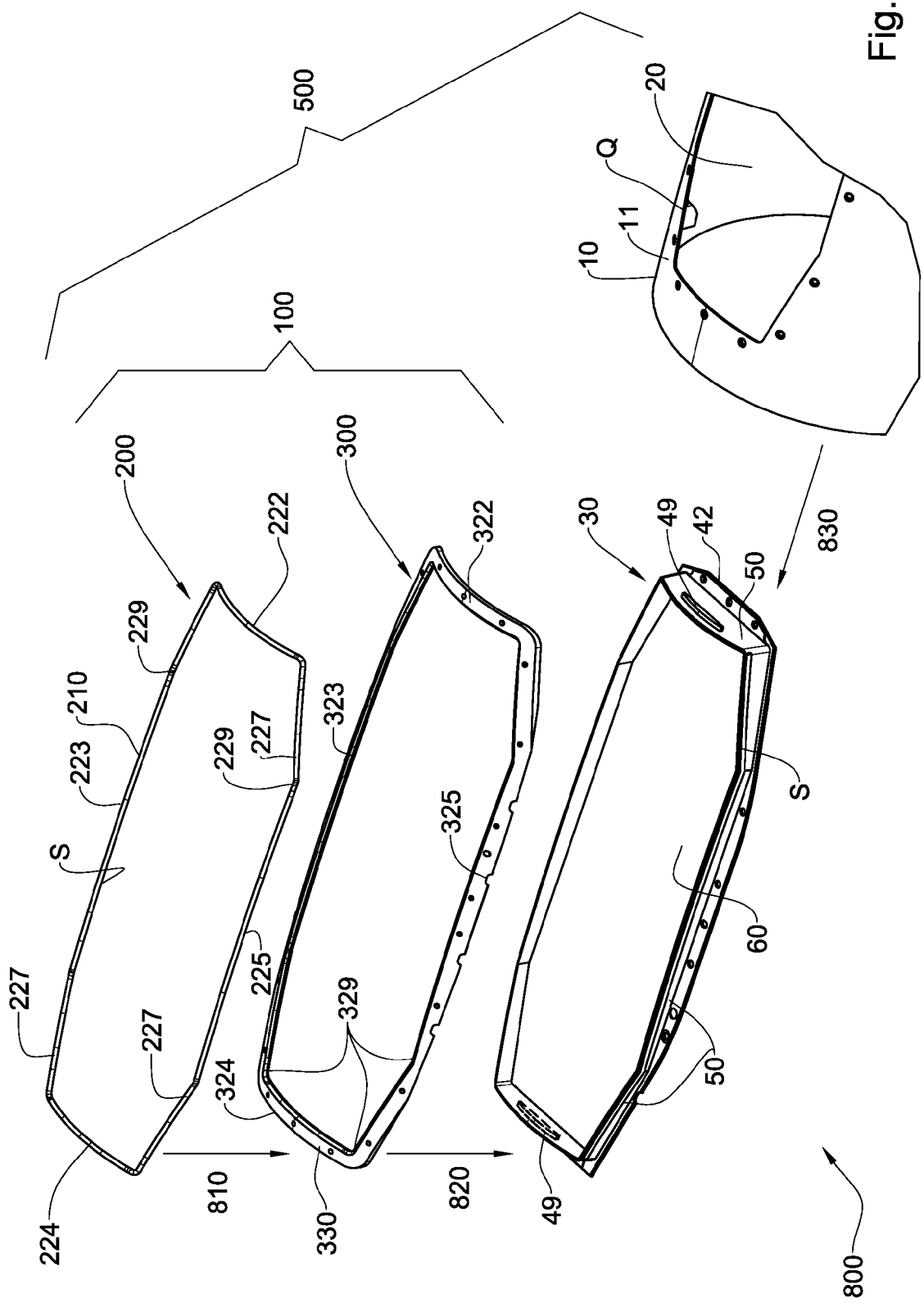
FIG. 1 schematically illustrates in isometric exploded view a sealing system according to a first example of the presently disclosed subject matter, and an associated sealing method.
Figure 2:
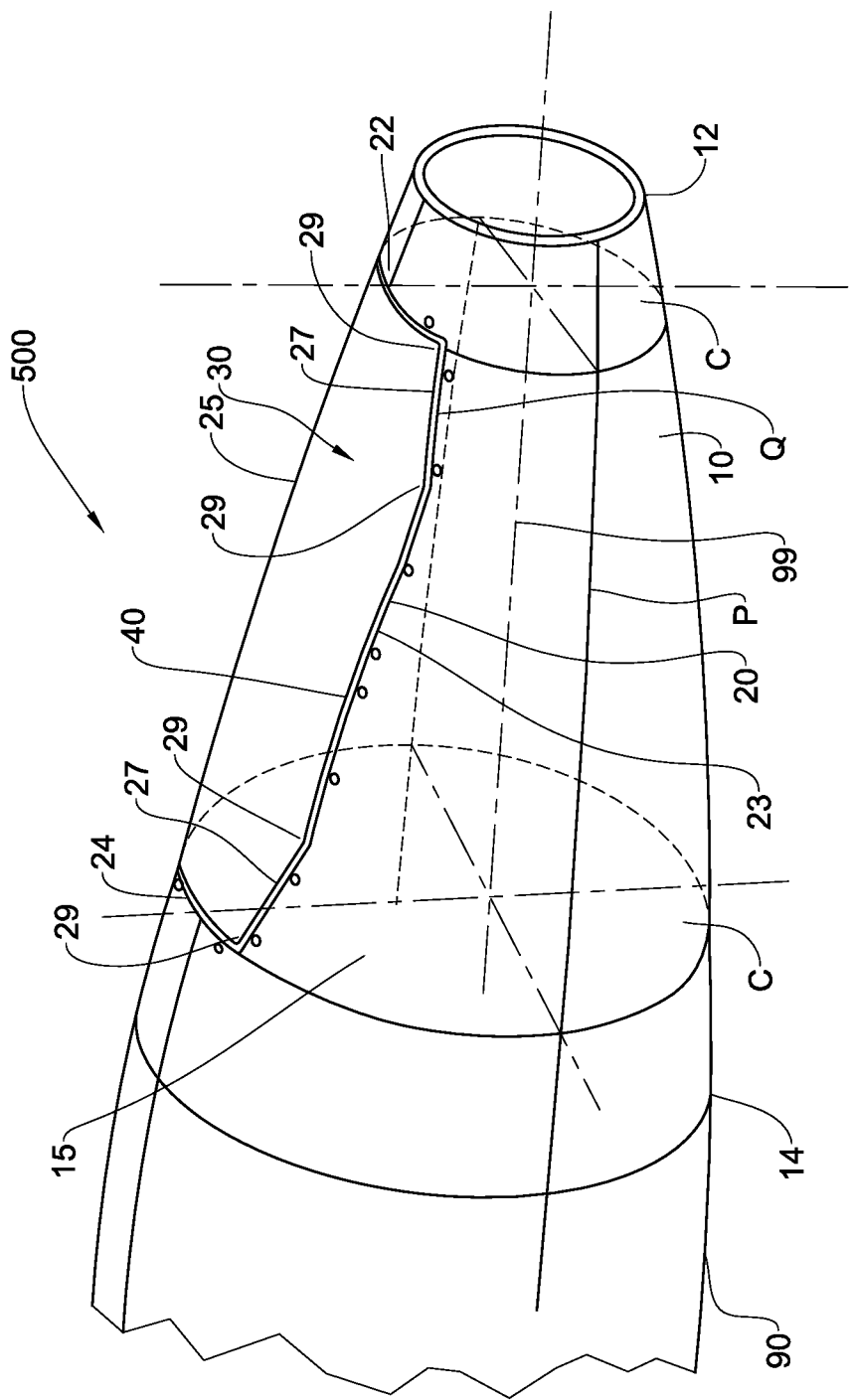
FIG. 2 schematically illustrates in isometric view the example of sealing system of FIG. 1 in a sealing position.

According to a first aspect of the presently disclosed subject matter, there is provided a sealing device, sealing system and sealing method, for providing an environmental seal between two components, wherein the sealing perimeter therebetween is non-planar, and there is further provided and an associated assembly.

Referring to FIGS. 1, 2, 3 and 3A, a first example of a sealing system according to the first aspect of the presently disclosed subject matter, and generally designated 100, comprises a mechanical sealing member 200, which is also referred to interchangeably herein as sealing device 200, and a support member 300, which is also referred to interchangeably herein as carrier member 300. In particular the sealing system 100 is configured for sealing between two components, thereby providing an environmental seal at a sealing perimeter S therebetween, wherein the sealing perimeter S is non-planar.

Figure 3:
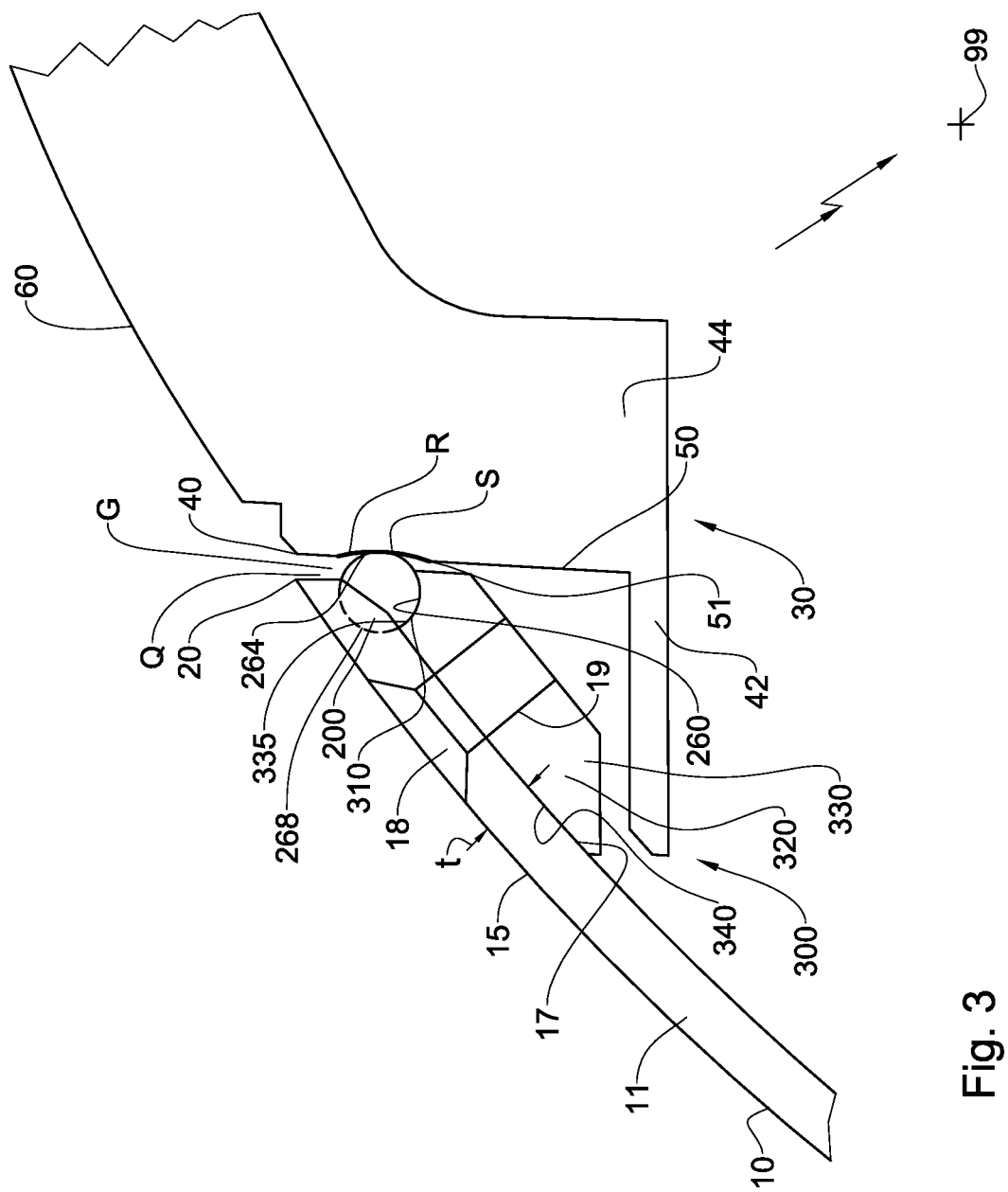
FIG. 3 schematically illustrates in partial cross-sectional view the example of sealing system of FIG. 2 in sealing position.

In this example, sealing system 100 is configured for sealing between a first component, in the form casing 10, and a second component, in the form of structure 30, to provide assembly 500 including the sealing system, the first component and the second component. In particular, sealing system 100 is configured for sealing between an opening 20 in a casing 10 having a perimeter Q, and structure 30 that is at least partially housed in the casing 10, about sealing perimeter S. Referring in particular to FIG. 3, the second component, in this example the structure 30, comprises a component perimeter R in registry with said opening 20, and a gap G is defined between the opening 20 and the component perimeter R, and extends into the casing 10; the sealing member 200 provides said sealing between the first component (in this example the casing 10) and the second component (in this example the structure 30) along the gap G.

The casing 10 comprises a skin 11 having an outer surface 15, and an inner surface 17 at least in the vicinity of and around the opening 20, the inner surface 17 being spaced from outer surface 15 by a casing thickness t. The thickness t is nominally uniform in the vicinity of and around the opening 20, and thus inner surface 17 is generally similar in shape to outer surface 15 at least in the vicinity of and around the opening 20. The casing 10 also defines a longitudinal axis 99 with respect thereto.

In this example, the structure 30 comprises a base member 42 and a projecting member 44. The projecting member 44 is generally prismatic, having a generally octagonal cross-section in plan view defining eight sides 50. In this example, the sides 50 project from the base member 42 in a generally perpendicular manner with respect thereto, and thus in use the sealing perimeter S, and the sealing member 200 can be displaced along the sides 50 towards and away from the base member 42 while at the same time providing a seal with the sides 50.

The structure 30 further comprises an upper surface 60. The upper surface 60 is shaped to provide the structure 30 with conformal compatibility with respect to the outer surface 15 of casing 10. In other words, upper surface 60 is generally conformal with respect to outer surface 15, and thus upper surface 60 generally follows the shape that the casing 10 would have had in the space enclosed by opening 20, in the imaginary event of the casing 10 extending into this space instead of upper surface 60.

In alternative variations of this example and/or in other examples, the projecting member can have any other cross-sectional shape, for example oval, circular, elliptical, super elliptical, oval, pear-shaped, polygonal and so on. In alternative variations of this example and/or in other examples, the upper surface is non-conformal, but lies within a predefined envelope in proximity to such a conformal surface.

In this example, the base member 42 is integral with the projecting member 44, and comprises the upper surface 60. In alternative variations of this example and in other examples, the structure 30 comprises a sub-component laterally enclosed by the projecting member and having an upper surface which forms part of the upper surface 60.

In operation, and as will be described in more detail below, in at least one example in which the structure 30 is affixed to another body 90 (FIG. 2), casing 10 can be mounted to the body 90 with opening 20 in registry with upper surface 60, and system 100 seals the opening 20 with respect to the structure 30, in particular the sides 50 thereof, via sealing perimeter S.

For example, body 90 can comprise part of a fuselage, pod or projectile (including a missile).

For example, structure 30 can include sensor and/or radar instrumentation or components, and upper surface 60 can be at least a part of a conformal antenna, or at least a part of a conformal radome for an antenna, for example.

For example, casing 10 can comprise part of a fuselage, pod or projectile (including a missile), for example the nose or aft end of the fuselage, pod or projectile (including of a missile).

The sealing perimeter S is generally similar in profile, including shape and size, to the profile of periphery Q of the opening 20, but is spaced inwardly therefrom towards axis 99, as best seen in FIG. 3.

The opening 20 has a non-equilateral and generally polygonal plan form, in particular an octagonal plan form, generally elongated along the longitudinal direction parallel to axis 99. The periphery Q of the opening 20 includes first transverse edge 22 nearest to tip 12, second transverse edge 24 nearest to base 14, longitudinal edges 23 and 25, four diagonal edges 27, and eight vertices 29. Each longitudinal edge 23 and 25 is joined to the first transverse edge 22 and the second transverse edge 24 via a respective diagonal edge 27. The eight vertices 29 of opening 20 are not true polygon vertices, as they are in the form of rounded, rather than sharp, corners.

The casing 10 has a transverse cross-sectional profile that varies along axis 99. In particular, the transverse cross-sectional profile of the casing 10 increases from the tip 12 to the base 14. In this example, the casing 10 defines a series of transverse cross-sections C along axis 99 having respective profiles that are essentially similar in shape to one another, but that increase in size from the tip 12 to the base 14. While in this example the cross-sections are circular, in alternative variation of this example, and in other examples, the transverse cross-sections C can be any other suitable shape, including for example elliptical, super-elliptical, oval, polygonal (e.g. concave polygon, convex polygon, self-intersecting polygon), and so on, and/or, the transverse cross-sections C can have a size and/or shape that varies between the tip 12 and the base 14.

Furthermore, in this example the casing 10 is axi-symmetric about longitudinal axis 99, and has a plurality of longitudinal cross-sections P, defined on a corresponding plurality of planes that intersect one another at axis 99. Each longitudinal cross-section P has an ogive profile, and these profiles are similar to one another in size and shape. However, in alternative variations of this example, and in other examples, the longitudinal cross-sections P can be any other suitable shape, including for example triangular (providing a cone-shaped or pyramidal-shaped casing 10), or trapezoidal (providing a frusto-conical-shaped casing 10), or any other suitable shape, and/or, the longitudinal cross-sections P can have a profile that varies in size and/or shape about axis 99.

In alternative variation of this example, and in other examples, the size and/or shape of the transverse cross-sectional profiles of the casing can vary along the longitudinal direction, but this variation is limited to the immediate vicinity of the opening 20 (and optionally only between first end 22 and the second end 24), while the remainder of each respective cross-section has a shape and/or size that remains constant along the axis 99. Additionally or alternatively, the size and/or shape of the longitudinal cross-sectional profiles of the casing can vary about axis 99 only from the immediate vicinity of one side 23 to the immediate vicinity of the other side 25, while the remainder of each respective cross-section has a shape and/or size that remain(s) constant along the longitudinal direction.

In this example, the first transverse edge 22 and the second transverse edge 24 are each curvate, in particular outwardly curved, for example arcuate, each transverse edge being an arc of a circle defined by the respective circular transverse cross-section C, and thus the first transverse edge 22 has more curvature than the second transverse edge 24. The longitudinal edges 23 and 25 are also curvate, crossing a number of the aforementioned longitudinal cross-sections P; the diagonal edges 27 are also curvate and cross a number of the aforementioned longitudinal cross-sections P.

Thus, three-dimensionally, the opening 20, in particular perimeter Q thereof, defines or at least approximates a general skew polygon, in which the vertices thereof do not lie on a common plane, but rather on the non planar surface defined by skin 15 at least in the vicinity of the opening 20. Furthermore, by "general" is meant that while the opening 20 can define a true skew polygon, it can include variations from a true skew polygon, in which the edges can be rectilinear or non-rectilinear (e.g. curvate), and/or, wherein the vertices can be true (sharp) vertices or in the form of rounded corners.

In alternative variations of this example and/or in other examples, the opening 20 forms a closed shape that is non-polygonal even in plan view, for example having at least a plan form that is circular, elliptical, super-elliptical, oval, pear-shaped and so on.

Similarly, the sealing perimeter S also defines a general skew polygon, similar in shape and size to that of the opening 20, but spaced from perimeter Q of opening 20.

The sealing member 200 is configured for providing said sealing perimeter S between opening 20 and structure 30, and has a shape generally resembling the aforementioned general skew polygon, at least when sealing member 200 is in its sealing position between opening 20 and structure 30. In the sealing position the sealing member 200 is aligned with the structure 30 along the sealing perimeter S.

Thus, referring in particular to FIG. 1, the sealing member 200 functions as a generally non-planar gasket, at least when in use in the sealing position, and comprises an elongate body 210 that is looped to form a closed polygonal shape, and forming a general skew polygonal shape at least in the aforesaid sealing position. The sealing member thus comprises a first transverse portion 222, a second transverse portion 224, longitudinal portions 223 and 225, four diagonal portions 227, and vertices 229, respectively corresponding to and having similar shape to: first transverse edge 22, second transverse edge 24, longitudinal edges 23 and 25, the four diagonal edges 27, and the vertices 29, of opening 20.

In alternative variations of this example and/or in other examples, the sealing member comprises an elongate body that is looped to form a closed shape that is non-polygonal, for example having at least a plan form that is circular, elliptical, super-elliptical, oval, pear-shaped and so on.

In this example, the sealing member 200 comprises a nominal round transverse cross-sectional shape, i.e., when unstressed the cross-section is circular, but this can be significantly deformed under compression and/or tension, particularly in use when the sealing member 200 is in the sealing position. In alternative variations of this example, and in other examples, sealing member 200 comprises any other suitable nominal cross-sectional shape, including for example other closed shapes such as oval, elliptic, polygonal, or open shapes such as for example C-shaped, Y-shaped, H-shaped, and so on.

In any case, the sealing member 200 is made from a material that is yielding, as is well known in the art, such that it is able to deform and tightly fill the gap G between the opening 20 and structure 30, including any slight irregularities therein, and taking into account acceptable tolerance ranges of the dimensions of opening 20 and of structure 30.

For example, the sealing member 200 can be made from rubber, silicone, certain composite sealing materials, for example.

As will become clearer below, the support member 300 is configured for:

supporting the sealing member 200 in a non-planar configuration wherein to provide said non-planar sealing perimeter S; in this particular example, the support member 300 is configured for supporting the sealing member 200 in the aforementioned general non-planar form, in particular the aforementioned general skew polygonal shape;

enabling the sealing member 200 to assume a desired relative position with respect to the structure 30 by mounting the support member 300 to the structure 30 at a fixed spatial disposition with respect thereto, such as to align the sealing member 200 with the structure 30 along the sealing perimeter S;

locking the sealing member 200 in the sealing position by affixing the support member 300 to the casing 10.

Support member 300 is different from and/or independent from said structure 30.

Support member 300 is generally non-planar, and in particular has a shape that varies along three orthogonal axes. Support member 300 is in the form of a generally non-planar rigid or semi rigid frame 330, i.e., the support member 300 has sufficient rigidity to at least maintain its desired generally non-planar shape under its own weight including the weight of the sealing member 200, at least when no external forces are applied thereto.

Support member 300 comprises a sealing member seat 310 and a flange portion 320, which are integral with one another in this example. The sealing member seat 310 is in the form of a peripheral recess along an upper part of the internal periphery 335 of the frame 330, the recess having a cross-sectional shape complementary to part of the transverse cross-sectional shape of the sealing member 200. Thus, in this example the recess has a concave arcuate transverse cross-section of similar curvature to that of the circular cross-section of the sealing member 200, and allows the sealing member 200 to be seated thereon in close contact thereto. Furthermore, the sealing member seat 310 has a three-dimensional form similar to the aforementioned general skew polygonal shape required for the sealing perimeter S.

The flange portion 320 comprises a first transverse portion 322, a second transverse portion 324, longitudinal portions 323 and 325, four diagonal portions 327, and vertices 329, respectively corresponding to: first transverse edge 22, second transverse edge 24, longitudinal edges 23 and 25, the four diagonal edges 27, and the vertices 29 of opening 20. Furthermore, the flange portion 320 comprises an upper surface 340 having a shape substantially complementary to corresponding parts of the inner surface 17, such as to enable the upper surface 340 to provide abutting contact with the corresponding parts of the inner surface 17 at the aforesaid sealing position, as will become clearer below.

In this example, the sealing member 200 has a resiliency that prevents it from naturally assuming the aforementioned general skew polygonal shape without the application and maintenance of an external force—for example the sealing member is originally manufactured in the form of a generally planar loop that can be manipulated into the required form of the sealing perimeter S. Rather, the sealing member 200 is affixed in place on the sealing member seat 310 in a seated position to thereby adopt the aforementioned general skew polygonal shape. This affixing can be accomplished for example using a suitable adhesive, a suitable welding technique, or any other suitable fixing method. For example the sealing member 200 can instead be mechanically affixed to the sealing member seat 310, for example by providing a plurality of hooking elements on the support member 300 that hook onto a part of the surface of the sealing member 200 close to the sealing member seat 310 while leaving the remainder of the sealing member 200 free to contact the structure 30 and compressively deform with respect thereto to form a seal at the sealing position, along sealing perimeter S.

Figure 3A:
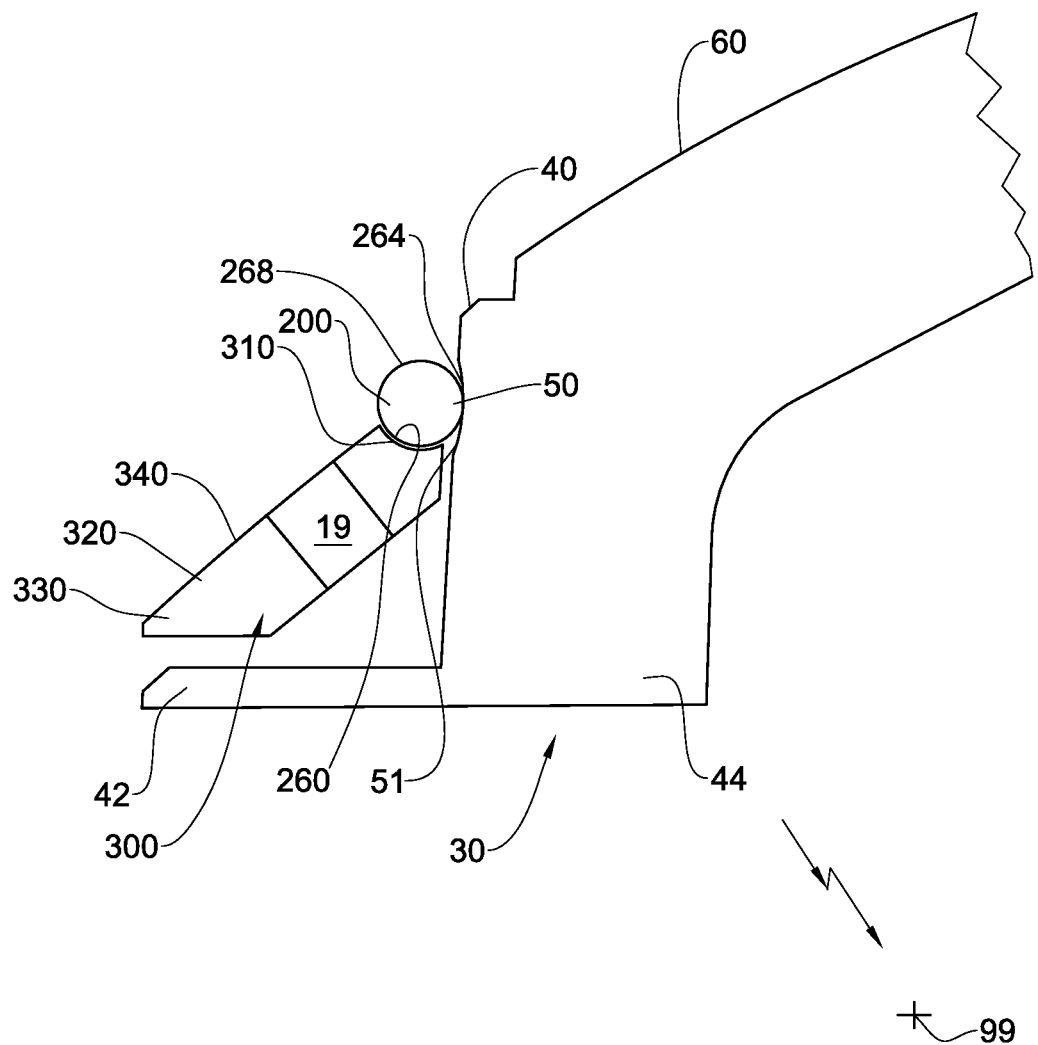
FIG. 3A illustrates in partial cross-sectional view the example of sealing system of FIG. 2 prior to sealing against the casing of FIG. 2.

As clearly illustrated in FIG. 3 and in FIG. 3A in the seated position the sealing member 200 is engaged to the support member 300 to assume an assembled configuration of system 100. In the assembled configurations, the sealing member 200 is affixed in place on the sealing member seat 310 via one part 260 of the surface of the sealing member 200 that is in abutting contact with the sealing member seat 310. An inner-facing part 264 of the sealing member 200 is designed to provide the sealing contact with the structure 30 at the sealing perimeter S, and another, outer-facing part 268 is provided that in use abuts against the inner surface 17 and/or perimeter Q.

In this example, and referring again to FIG. 3, the sides 50 of the projecting member 44 comprise a shallow recess 51 that circumscribes the sides 50 around the projecting member, and shallow recess 51 defines the desired position of the sealing perimeter S. the recess 51 can be helpful in facilitating contact and sealing of the sealing member 200 at sealing perimeter S. However, in alternative variations of this example, and in other examples, the recess can be omitted and the sides can be flat or curved without a recess, for example.

Referring in particular to FIG. 1, the structure 30 comprises a number of support brackets 49 that cooperate with the support member 300 to enable the sealing member 200 (when this is affixed to the support member 300) to assume the aforesaid desired relative position with respect to the structure 30. In this example, the projecting member 44 comprises the support brackets 49 at sides 50 thereof.

More particularly, the support member 300 is mounted to the structure 30 at a fixed spatial disposition with respect thereto, i.e., the aforesaid desired relative position, by resting or seating the flange portion 320 on the support brackets 49. At this fixed spatial disposition, the inner-facing part 264 of the sealing member 200 is in abutting contact with the shallow recess 51, and the upper surface 340 is at an abutting-enabling position to enable abutting contact with the corresponding parts of the inner surface 17 when the casing 10 is mounted to body 90.

In alternative variations of this example and in other examples, the support member 300 can be configured for mounting the structure 30 at the aforesaid fixed spatial disposition with respect thereto. For example, the support member 300 can comprise projections, such as for example legs, that projects towards and rest on the base member 42 to provide the aforesaid fixed spatial disposition with respect to the structure 30.

Referring in particular to FIG. 1, sealing of the structure 30 with respect to casing 10 can be carried out according to the following sealing method 800:

Step 810—the sealing member 200 is affixed to the support member 300 in the seated position to provide the assembled configuration of the system 100. In the seated position, the sealing member 200 is thus compelled to assume the aforementioned general skew polygonal shape.

Step 820—in the assembled configuration, the system 100 is mounted onto the structure 30 by engaging the flange portion 320 with the brackets 49. The inner-facing part 264 of the sealing member 200 is in abutting contact with the shallow recess 51, and can even be partially compressed with respect to the shallow recess 51 along the sealing periphery S (FIG. 3A).

Step 830—the casing 10 is brought into proximity with the structure 30, so that the system 100 is enclosed within the casing 10 and the structure 30 (in particular the upper surface 60) is in registry with the opening 20. At this point the upper surface 340 can be slightly spaced from the corresponding parts of the inner surface 17, and is brought into abutting contact with and fixedly secured to the casing 10, for example via screws 18 and corresponding aligned holes 19 provided in the casing 10 and the flange portion 320.

Abutment and securing of the system 100 with respect to the inner surface 17 of the casing 10 in turn sealingly affixes the support member 300 to the casing 10. Abutment and securing of the system 100 with respect to the inner surface 17 of the casing 10 compresses and deforms the outer-facing part 268 of the sealing member 200, forcing further compressive sealing contact between the inner-facing part 264 of the sealing member 200 and the shallow recess 51 at sealing perimeter S.

The sealing member 200 thus seals opening 20 with respect to the structure 30, i.e., seals the gap G between the opening 20 and the structure 30, via the sealing contact between outer-facing part 268 and the inner surface 17 of the casing 10 on the one hand, and the compressive sealing between the inner-facing part 264 of the sealing member 200 and the shallow recess 51 at sealing perimeter S, on the other hand. (FIG. 3)

Prior to step 810, or prior to step 820, or prior to step 830, the structure 30 can be mounted to another structure, for example body 90, for example via the base member 42. In such a case, in step 830 the casing 10 is also mounted to body 90, and is affixed thereto either just prior to, or subsequent to, the step of fixedly securing the flange portion 320 to the casing 10. Alternatively, the structure 30 can be affixed to a suitable internal part of the casing 10 either just prior to, or subsequent to, the step of fixedly securing the flange portion 320 to the casing 10, and the assembly can optionally then be mounted to the body 90 whenever desired.

It is to be noted that in this example, the sealing method 800 is reversible, and it is possible to disassemble the sealing system 100 from the casing 10 and the structure 30 by reversing the aforementioned steps, for example. This feature allows for easy and low-cost maintenance of the assembly 500 with respect to the sealing system 100.

Thus, the system 100 provides an environmental seal between the opening 20 and the structure 30, and thus prevents fluid communication between the inside of the casing 20 and the external environment by the gap G between the opening 20 and the structure 30, thereby preventing dust, contaminants, moisture, and/or air from the external environment penetrating into the casing 10.

Figure 4:
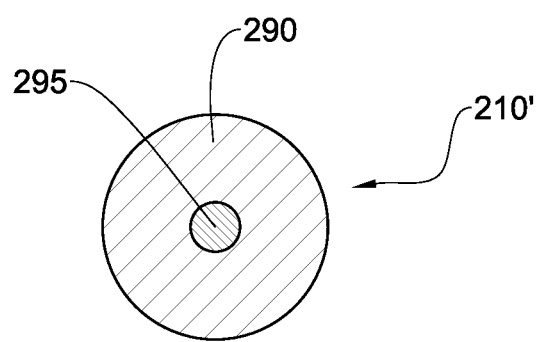
FIG. 4 schematically illustrates in cross-sectional view a variation of the example of the sealing member of the sealing system of FIGS. 1 to 3.

In an alternative variation of the first example of system 100, and according to another aspect of the presently disclosed subject matter, the sealing member 200 is configured for assuming the aforementioned general skew polygonal shape without the application and maintenance of an external force. Thus, in this example, the sealing member 200 can be mounted to and affixed in place on the sealing member seat 310 in the seated position in the aforementioned general skew polygonal shape, without having to force the sealing member into a biased position against its resiliency. The sealing member can be simply mounted onto the support member 300 and loosely held together in step 830, or can be affixed to the support member 300 using a suitable adhesive, a suitable welding technique, mechanical fixing, or any other suitable fixing method as before. For example, and referring to FIG. 4, such an example of the sealing member 200 can include an elongate body 210' that is looped to form a closed polygonal shape, and forming the aforementioned general skew polygonal shape. The elongate body 210' comprises an outer sealing portion 290 concentrically enclosing an inner core 295. The sealing portion 290 is configured for providing the required environmental sealing between casing 10 and the structure 30 and can be made from a resilient sealing material, for example similar to as described herein regarding the first example, mutatis mutandis. The core 295 is configured to internally support the sealing member 200, in particular the elongate body, in a non-planar form, in particular in the form of the aforementioned general skew polygonal shape. The core 295 thus compels the elongate body 210', and thus the sealing structure 200, to adopt the aforementioned general skew polygonal shape. For example, the core 295 can be made from a suitable shape-memory alloy (also referred to interchangeably herein as SMA, smart metal, memory metal, memory alloy, muscle wire, smart alloy, and so on) and is cold-forged to a particular, desired datum shape—in particular the aforementioned general skew polygonal shape. Thus, even if severely deformed from this shape via an external force, the core will "remembers" and return to its original datum shape after release from this external force. Thus, the body 210' can be manipulated until mounted onto the support member 300 without fear of losing the datum shape, so long as this is done at a temperature less than the respective $A_s$ and $A_f$ temperatures of the shape memory alloy. For example, the core 295 can be made from copper-aluminium-nickel alloy, or from nickel-titanium and (NiTi) alloys. In any case, the core 290 is designed to provide the required datum shape, such as the aforementioned general skew polygonal shape, even while resisting a biasing away from such a shape due to the resiliency of the outer sealing portion 290.

Alternatively, the core may be made from a different material than a shape-memory alloy, and provides a rigid or semi rigid internal support for the sealing member in particular the elongate body, in the required non-planar form. For example, the core may be made from Invar or Titanium or any other suitable metal, for example.

The casing 10 and the structure 30 can be made from materials having the same or similar properties, in particular physical properties, for example thermal properties. Alternatively, casing 10 and the structure 30 can be made from materials having dissimilar properties, in particular physical properties, for example thermal properties.

According to a second aspect of the presently disclosed subject matter, the sealing system 100 is optionally further configured for providing the required environmental sealing between the casing 10 and the structure 30 for a range of environmental conditions, including at least a range of temperatures. For example, according to this aspect of the presently disclosed subject matter, the casing 10 (in particular, at least a part of the casing 10 in the vicinity or and around opening 20) and the structure 30 (in particular, at least a part of the structure 30 in the vicinity or and around opening 20) are optionally made from materials having significantly different coefficients of thermal expansion one from the other. For example, the ratio between the coefficients of thermal expansion of the two components can be in the range 2 to about 10, for example 5.7±0.3.

Such environmental conditions can also include conditions in which there can be a significant difference between the temperature felt by one component and the other, for example several hundred of degrees Centigrade. For example, the casing 10 can experience temperatures of about 500° C. while the structure 30 can experience a lower temperature, for example 200° C., at the same time.

For example, under conditions of high temperature or of very low temperature, the casing 10 expands or contracts substantially more than the structure 30, or alternatively the structure 30 expands or contracts substantially more than the casing 10, with respect to their relative geometries at room temperature, for example. According to this aspect of the presently disclosed subject matter the support member 300 can be made of the same material as the casing 10, or from another material, but having a coefficient of thermal expansion similar to that of the casing 10.

For example, casing 10 and the support member 300 can be made from titanium or aluminium, while the structure 30 can be made from material Invar, stainless steel, aluminium, and so on, and which expands or contracts mush less than the material of the casing 10 when subjected to a change in temperature. According to this aspect of the presently disclosed subject matter, the sealing member 200 is heat resistant and configured for providing a mechanical seal at perimeter S for a predetermined range of temperatures, for example between −10° C. to about 500° C., or −50° C. to 700° C., and is thus made from a heat resistant material, for example silicone based, as are known in the art.

According to this aspect of the presently disclosed subject matter, the sealing member 200 has a cross-section (for example a cross-sectional diameter or other characteristic dimension) that is sized to provide compressive sealing contact at perimeter S for such a range of temperatures, wherein an average size of the gap between the opening 20 and structure 30 can increase by up to 20%, 30%, 40%, for example and/or decrease by up to 20%, 30%, 40%, for example, wherein 100% represents the average size of the gap at room temperature.

According to a third aspect of the presently disclosed subject matter, the sealing system 100 is optionally further configured for providing EMI (electromagnetic interference) shielding, providing an electrically conductive seal between the casing 10 and the structure 30 to prevent or restrict electromagnetic interference. Further optionally, such EMI shielding can be provided by system 100 together with providing the required environmental sealing between the casing 10 and the structure 30, further optionally for a range of environmental conditions, including at least a range of temperatures, as per the second aspect of the presently disclosed subject matter. Further optionally, such EMI shielding can be provided by system 100 even in the absence of concurrently providing the required environmental sealing between the casing 10 and the structure 30—for example such EMI shielding can still be provided even where the seal has failed and there is leaking into or out of the casing through sealing element 200.

In one example according to this aspect of the presently disclosed subject matter, the sealing member 200 itself is configured for providing EMI shielding, and acts as an EMI gasket, in addition to providing An environmental seal between the casing 10 and the structure 30. For example, the sealing member 200 can be made from suitable EMI shielding materials that also provide a mechanical seal. Examples of such suitable materials include EMI shielding materials having silicone rubber capabilities, for example electrically conductive silicone rubber compounds provided by Stockwell Elastomerics, USA. In at least some examples the sealing member 200 can be made from conductive elastomer materials providing EMI shielding as well as environmental sealing between the casing 10 and the structure 30 over a broad temperature range, and at least some such materials meet the properties of Mil-G-83528B.

In at least some examples the sealing member 200 can be made from silicone rubber or fluorosilicone rubber with embedded silver plated aluminum particles, silver plated glass beads, silver plated copper particles, nickel-graphite particles or conductive carbon.

In at least some examples the sealing member 200 comprises Rogers' EC2130 and EC2040 nickel-graphite filled silicone rubber, which is a compressible 30 and 40 durometer conductive gasketing material.

In at least some examples the sealing member 200 comprises an oriented electrically conductive mesh impregnated with silicone, for example silicone-impregnated Monel mesh (QQ-N-281) or Aluminum mesh (AMS-4182, alloy 5056), provided by Stockwell Elastomerics, USA.

In at least some examples the sealing system 100 provides EMI shielding by absorbing electromagnetic (EM) energy and converting this into heat that is then dissipated—for example, the sealing member 200 is made from a flexible EMI absorbing material.

In another example according to the third aspect of the presently disclosed subject matter, the sealing system 100 is configured for providing EMI shielding independently of the sealing member 200. In this example the sealing system 100 comprises, in addition to sealing member 200 and support member 300, an EMI shielding member 400 configured for providing electrical conductivity between the casing 10 and the structure 30, while allowing sealing member 200 concurrently to provide environmental sealing therebetween.

According to the third aspect of the presently disclosed subject matter, the sealing system 100 is optionally configured for providing EMI shielding independently of the sealing member 200, concurrently together with providing additional EMI shielding via the sealing member 200, i.e. wherein the sealing member 200 itself is also configured for providing EMI shielding, and acts as an EMI gasket, for example as described above, mutatis mutandis.

Figure 5:
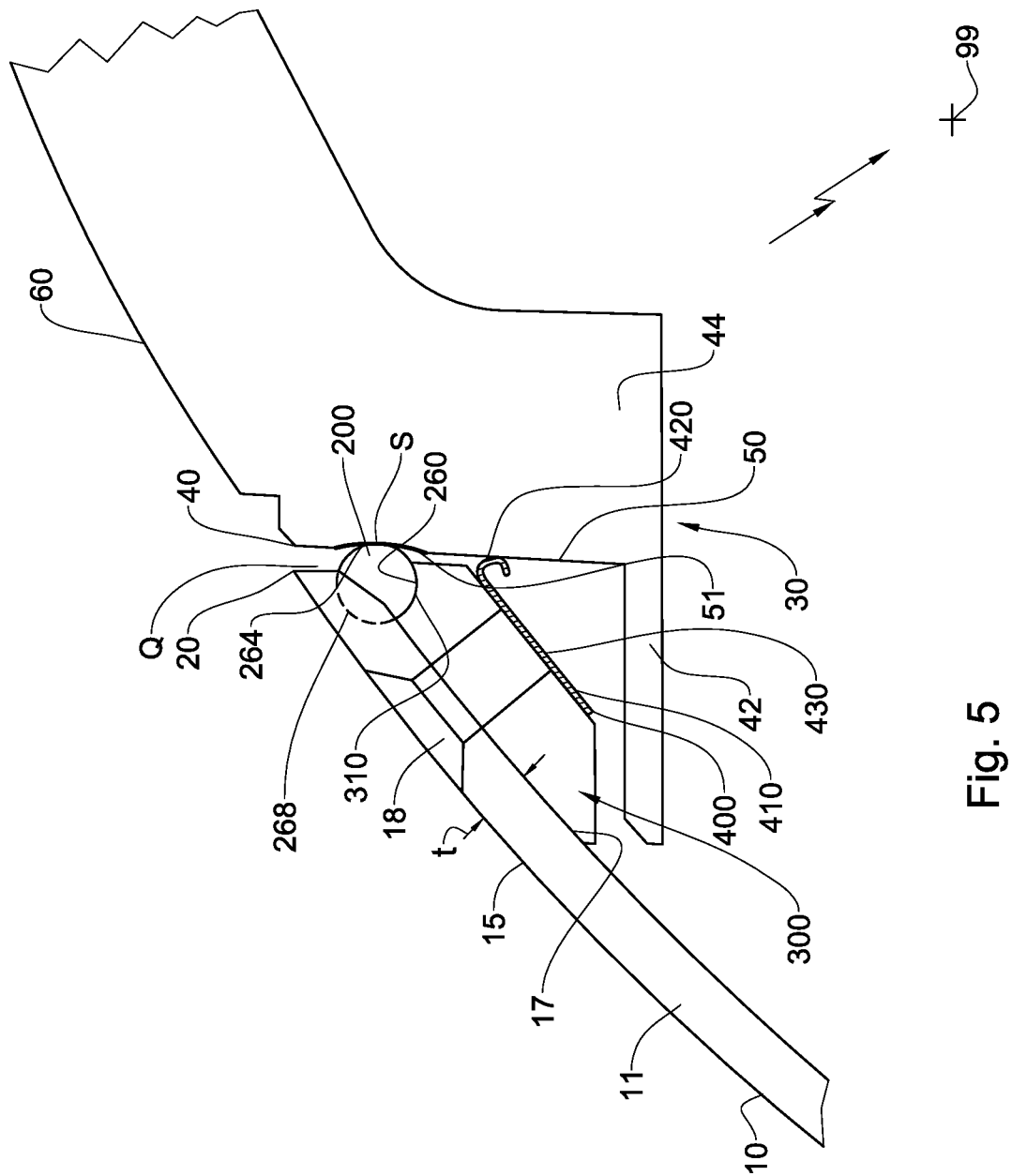
FIG. 5 schematically illustrates in partial cross-sectional view an alternative variation of the example of sealing system of FIG. 3.

Referring to FIG. 5, an example of the EMI shielding member 400 is illustrated, this example of the EMI shielding member 400 being in the form of a plurality of electrically conductive fingers 410, each finger 410 comprising a base portion 430 and a contact end 420. The base portion 430 is configured for being affixed to an underside of the support member 300 and in electrical communication therewith. The contact end 420 that is configured for coming into electrical communication with the structure 30, in particular the sides 50, at least when the system 100 is providing an environmental seal between the casing 10 and the structure 30. The contact end 420 is cantilevered from the affixed base portion 430, and has a convex curvate form biased to abut against the respective side 50 when the sealing system 100 is mounted to the structure 30. Each finger 410 is resilient and electrically conductive. For example, each finger 410 is in the form of a foil or leaf spring, and is made from a resilient and electrically conductive material, for example a metal, for example a metal taken from the group including: titanium, aluminium, copper, brass, gold, silver, platinum, and so on, or non-metallic electrically conductive material. The plurality of fingers 410 can be arranged around the periphery of the carrier member 300 wherein adjacent pairs of fingers 410 are spaced from one another along the periphery by a spacing. Such a spacing can be related to the specific wavelength or range of electromagnetic (EM) wavelengths that it is desired to shield from, for example being less than a quarter of the minimum such EM wavelength.

Alternatively, the fingers can be replaced with a continuous conducting member along the inner periphery of the support member 300 that provides continuous electrical communication with the structure 30, in particular the sides 50, The system 100, including EMI shielding member 400, can be operated to provide the aforesaid environmental sealing between the casing 10 and the structure 30 in a similar manner to method 800 or alternative variations thereof for example as described above, mutatis mutandis, with the additional step 840 of affixing the EMI shielding member 400 to the support member 300, and the step 850 of establishing electrical contact between the casing 10 and the structure 30.

For example, step 840 can be executed prior to step 810, and thus in the illustrated example the fingers 410 are affixed to the support member 300 prior to the sealing member 200 being affixed to the support member 300, and thereafter the support member 300 with the affixed sealing member 200 and EMI shielding member 400 provide the assembled configuration of the system 100. Alternatively, step 840 can be executed after step 810 but prior to step 820, and thus in the illustrated example the fingers 410 are affixed to the support member 300 after the sealing member 200 has been affixed to the support member 300; thereafter the support member 300 with the affixed sealing member 200 and EMI shielding member 400 provide the assembled configuration of the system 100.

Step 850 is concurrent with steps 820 and 830. As the system 100 is being mounted onto the structure 30 by engaging or placing the flange portion 320 with the brackets 49 in step 820, in this example the contact ends 420 of fingers 410 press onto the sides 50 while the inner-facing part 264 of the sealing member 200 is brought into abutting contact with the wall 50, in particular shallow recess 51, along the sealing periphery S. The physical contact between fingers 410 press and the sides 50 establishes electrical communication between the support member 300 and the structure 30. Then, in step 830, as the casing 10 is brought into proximity with the structure 30, so that the upper surface 340 is in proximity with and then in abutting contact with the corresponding parts of the inner surface 17 and the support member 300 is fixedly secured to the casing 10, electrical communication is established between the casing 10 and the support member 300. In turn, this completes electrical communication between the casing 10 and the structure 30, via the support member 300 and the EMI shielding member 400, while, concurrently the sealing member 200, provides environmental sealing between the casing 10 and the structure 30.

In the method claims that follow, alphanumeric characters and Roman numerals used to designate claim steps are provided for convenience only and do not imply any particular order of performing the steps.

Finally, it should be noted that the word "comprising" as used throughout the specification including the appended claims is to be interpreted to mean "including but not limited to".

While there has been shown and disclosed example examples in accordance with the presently disclosed subject matter, it will be appreciated that many changes may be made therein without departing from the spirit of the presently disclosed subject matter.

The invention claimed is:

1. An assembly, comprising:
   a first component having a first outer surface defining an opening therein;
   a second component having second surface; and
   a sealing system including:
      a sealing member configured for providing sealing between said first component and said second component with respect to said opening and along a generally non-planar sealing perimeter; and
      a support member configured for supporting said sealing member in a generally non-planar configuration corresponding to said generally non-planar sealing perimeter;
   wherein the support member is seatable onto the second component in a sealing position to thereby align said sealing member with said second component along said sealing perimeter, and
   wherein said support member is configured for being sealingly affixed to and in contact with said first component subsequent to said sealing system being seated onto said second component in said sealing position.

2. The assembly according to claim 1, wherein said second component comprises a component perimeter in registry with said opening, the system defining a gap between said opening and said component perimeter, and wherein said sealing member provides said sealing between said first component and said second component along said gap.

3. The assembly according to claim 1, wherein said second surface is generally conformal with respect to said first surface.

4. The assembly according to claim 1, wherein said sealing perimeter is of a general skew polygonal shape.

5. The assembly according to claim 1, further configured to provide electromagnetic interference (EMI) shielding between said first component and said second component.

6. The assembly according to claim 5, wherein said sealing member is electrically conducting.

7. The assembly according to claim 1, wherein said first component and said second component are made from materials having significantly different thermal expansion characteristics one from the other.

8. The assembly according to claim 7, wherein a ratio between the respective coefficients of thermal expansion of said first component and said second component are in a range of about 2 to about 10.

9. The assembly system according to claim 1, wherein said support member is made from a material having thermal expansion characteristics similar to the thermal expansion characteristics of one of said first component.

10. The assembly according to claim 1, further comprising an electromagnetic interference (EMI) shielding member, different from said sealing member.

11. A sealing assembly, comprising:
   a sealing system in sealing configuration with respect to two components,
   the sealing system comprising:
      a sealing member configured for providing sealing between said two components along a generally non-planar sealing perimeter; and
      a support member, different from said two components, configured for supporting said sealing member in a generally non-planar configuration to provide said non-planar sealing perimeter, wherein said support member is made from a material having thermal expansion properties similar to the thermal expansion properties of one of the two components, wherein said two components have respective thermal expansion properties different from one another; and wherein:
  the sealing member is mounted onto the support member;
  the support member is seated onto one of the components to seal with respect thereto about said sealing perimeter; and
  the support member is affixed to and in contact with the other one of said components.

12. The sealing system according to claim 11, wherein, in use, said support member is affixed to one of the two components after the support member is seated in a sealing relationship to the other one of the two components.

13. The sealing system according to claim 11, wherein said support member has a shape that is at least one of the following: generally non-planar; a shape that varies along three orthogonal axes; or a general skew polygonal shape.

14. The sealing system according to claim 11, wherein said support member has a general skew polygonal shape corresponding to a general skew polygonal shape of the sealing perimeter.

15. The sealing system according to claim 11, wherein said support member is in the form of a generally non-planar rigid or semi rigid frame, and wherein said support member comprises a sealing member seat and a flange portion.

16. The sealing system according to claim 15, wherein said sealing member seat is in the form of a peripheral recess along an upper part of an internal periphery of the frame, the recess having a cross-sectional shape complementary to part of the transverse cross-sectional shape of the sealing member.

17. The sealing system according to claim 11, wherein said sealing system is configured for providing electromagnetic interference (EMI) shielding between the two components independently of said sealing member.

18. The sealing system according to claim 17, further comprising an electromagnetic interference (EMI) shielding member.

19. The sealing system according to claim 18, wherein said EMI shielding member comprises a plurality of electrically conductive fingers, each of the plurality of electrically conductive fingers being configured for being affixed to the support member and in electrical communication therewith, and for establishing further electrical contact by physically contacting one of the two component when the sealing system is mounted thereto.

20. A sealing method for providing sealing between two components along a generally non-planar sealing perimeter, the method comprising:
  providing a sealing system comprising a sealing member mounted onto a support member, wherein the support member is different from said two components, wherein said support member is configured for compelling said sealing member to assume a configuration capable of sealing along said generally non-planar sealing perimeter;
  using said sealing system to seal between the two components about said sealing perimeter; and
  seating the sealing system onto one of the components to seal with respect thereto about said sealing perimeter, and subsequently affixing the support member to and in contact with the other one of said components.

21. The sealing method according to claim 20, further comprising providing electromagnetic interference shielding between the two components concurrently with sealing between the two components.

* * * * *